US008354895B2

(12) United States Patent
Kawamoto et al.

(10) Patent No.: US 8,354,895 B2
(45) Date of Patent: Jan. 15, 2013

(54) DUPLEXER INCLUDING FIRST AND SECOND ADDITIONAL GRATING REFLECTORS

(75) Inventors: Toshihiko Kawamoto, Sayama (JP); Susumu Yoshimoto, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 320 days.

(21) Appl. No.: 12/736,459

(22) PCT Filed: Apr. 10, 2009

(86) PCT No.: PCT/JP2009/001663
§ 371 (c)(1),
(2), (4) Date: Oct. 7, 2010

(87) PCT Pub. No.: WO2009/125602
PCT Pub. Date: Oct. 15, 2009

(65) Prior Publication Data
US 2011/0032051 A1   Feb. 10, 2011

(30) Foreign Application Priority Data

Apr. 11, 2008 (JP) ................................. 2008-103851

(51) Int. Cl.
*H03H 9/72* (2006.01)
(52) U.S. Cl. ...................... 333/133; 333/195; 310/313 D
(58) Field of Classification Search .................. 333/133, 333/195; 310/313 D
See application file for complete search history.

(56) References Cited

U.S. PATENT DOCUMENTS

| 6,140,890 A * | 10/2000 | Sakairi ........................... 333/195 |
| 2005/0156687 A1* | 7/2005 | Matsuda et al. ............... 333/195 |
| 2007/0069837 A1* | 3/2007 | Nishimura et al. ........... 333/195 |
| 2009/0289741 A1 | 11/2009 | Ito ................................. 333/133 |

FOREIGN PATENT DOCUMENTS

| JP | 4-63010 | * | 2/1992 |
| JP | 5-167389 | | 7/1993 |
| JP | 6-013837 | | 1/1994 |
| JP | 6-224685 | | 8/1994 |
| JP | 9-232908 | | 9/1997 |
| JP | 11-145776 | * | 5/1999 |
| JP | 2000-022491 | | 1/2000 |
| JP | 2007-097117 | | 4/2007 |
| WO | WO-2007/049699 | | 5/2007 |

* cited by examiner

*Primary Examiner* — Barbara Summons
(74) *Attorney, Agent, or Firm* — Jordan and Hamburg LLP

(57) ABSTRACT

Disclosed is a miniaturized duplexer having a good isolation characteristic. A duplexer having a high band side filter and a low band side filter that are each formed in a ladder-type filter provided on a common piezoelectric substrate is provided with a first elastic wave resonator to be included in one of these filters, a second elastic wave resonator to be included in the other of the filters, and a first additional grating reflector provided between these resonators to reflect an elastic wave leaked from a grating reflector of the first elastic wave resonator, and in which an additional grating reflector is not provided on a side opposite to the second elastic wave resonator in the first elastic wave resonator.

4 Claims, 15 Drawing Sheets

Fig.6
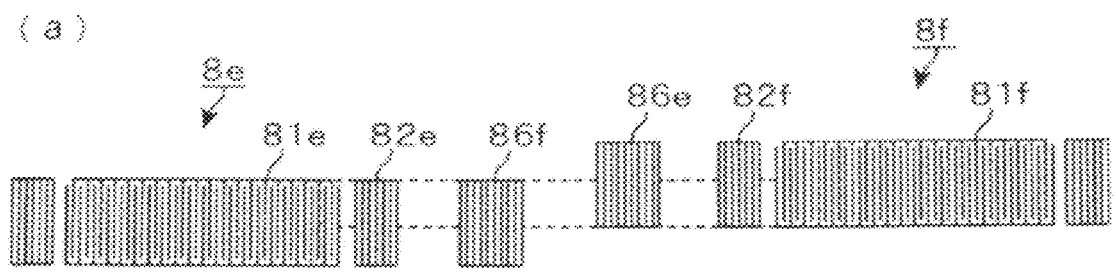
(a)
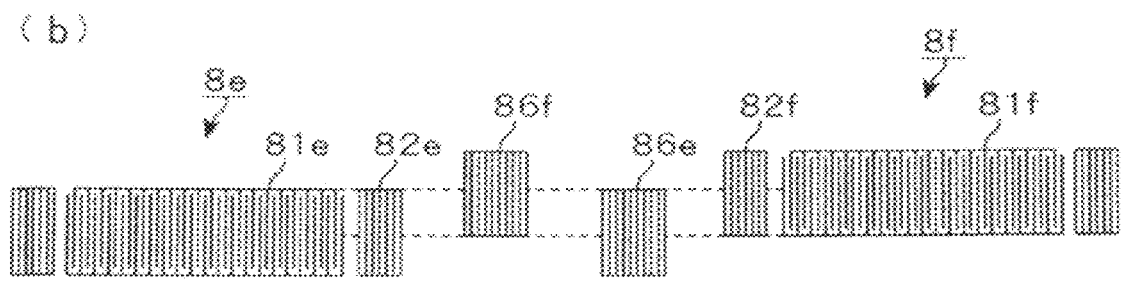
(b)
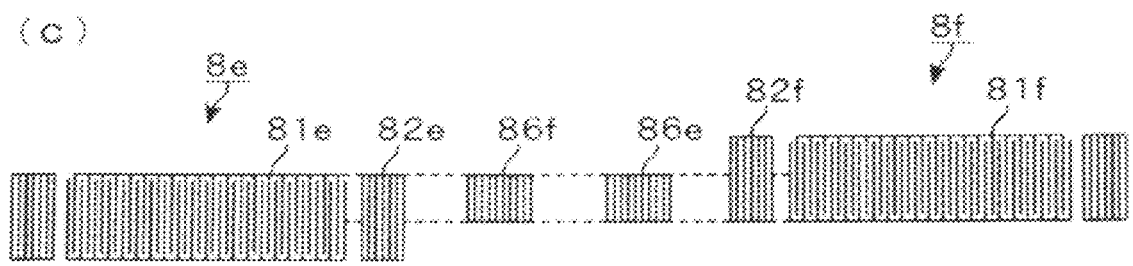
(c)
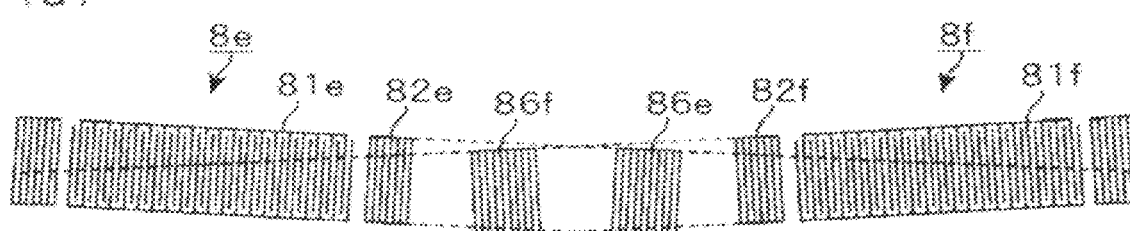
(d)

Fig. 10
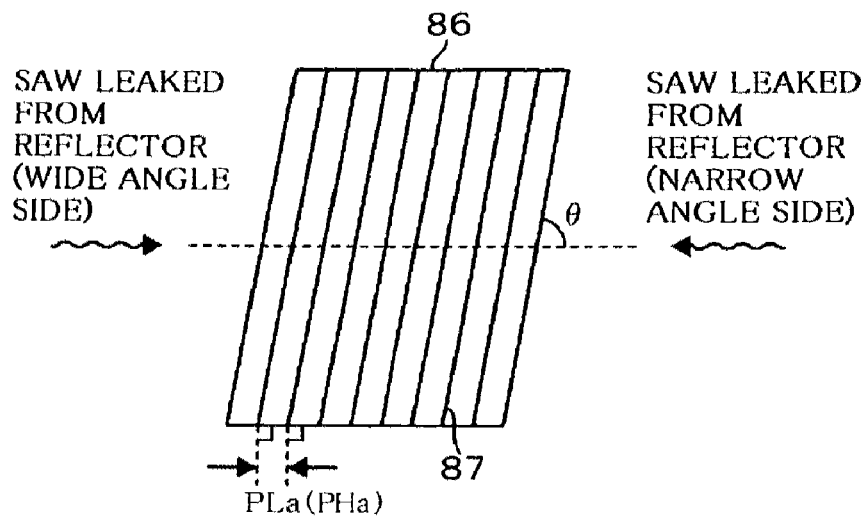
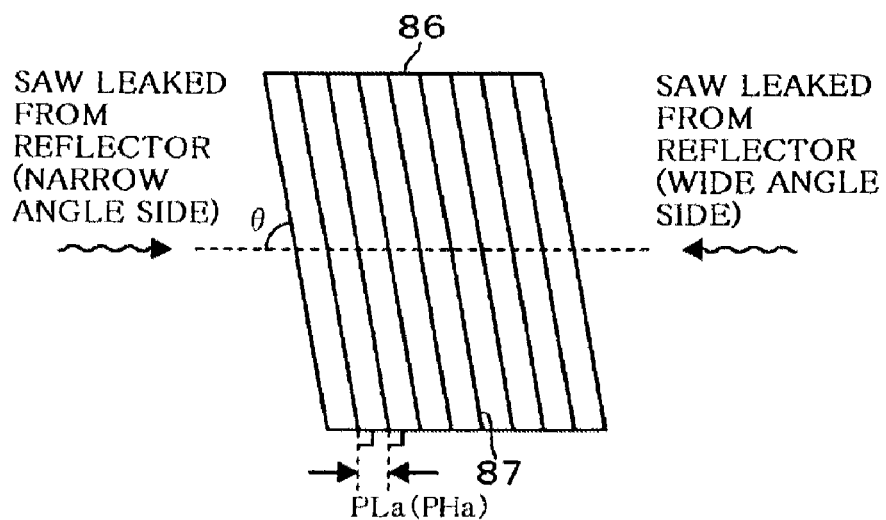
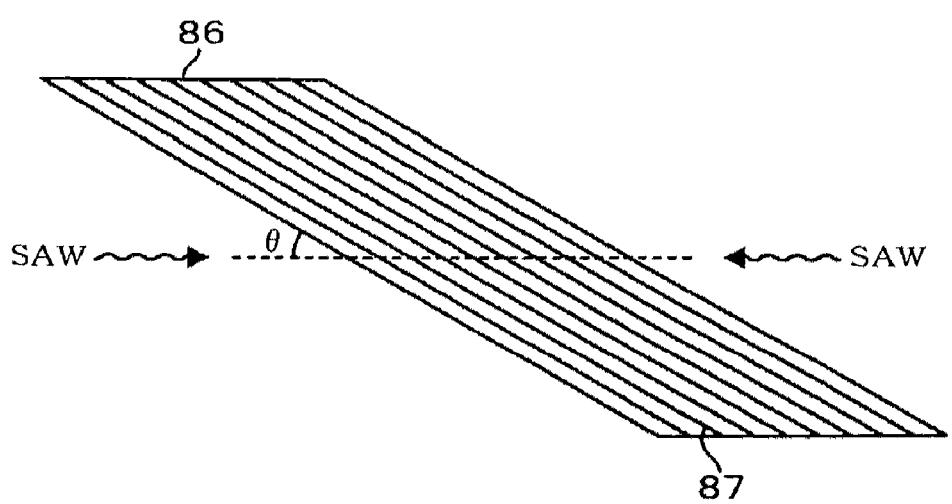

Fig.12
(a) EXAMPLE
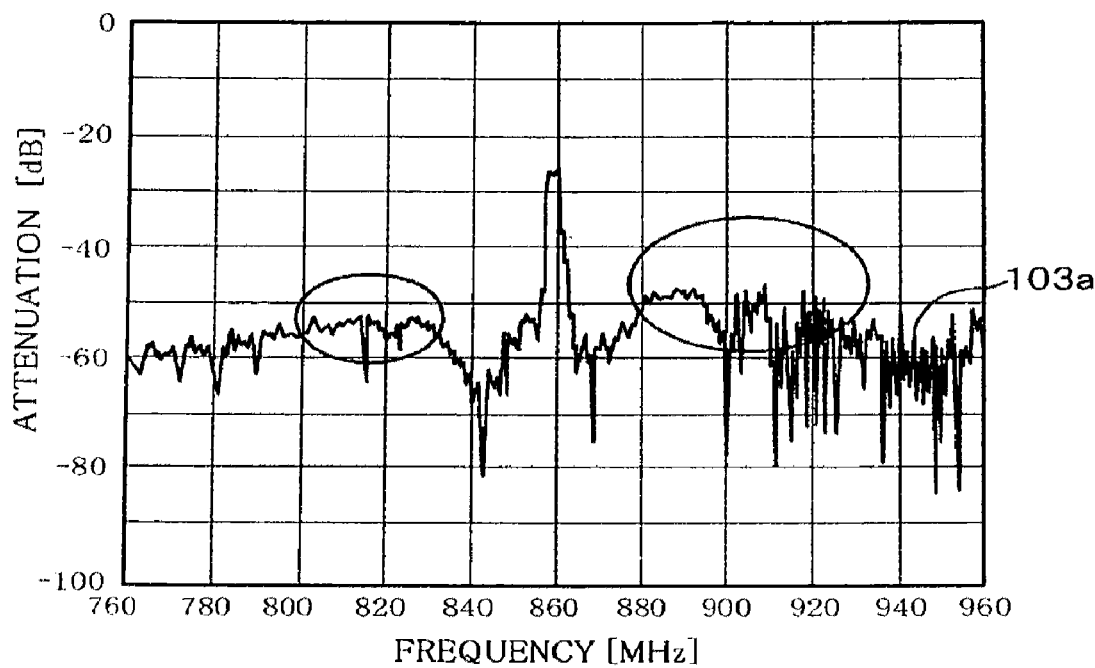
(b) COMPARATIVE EXAMPLE
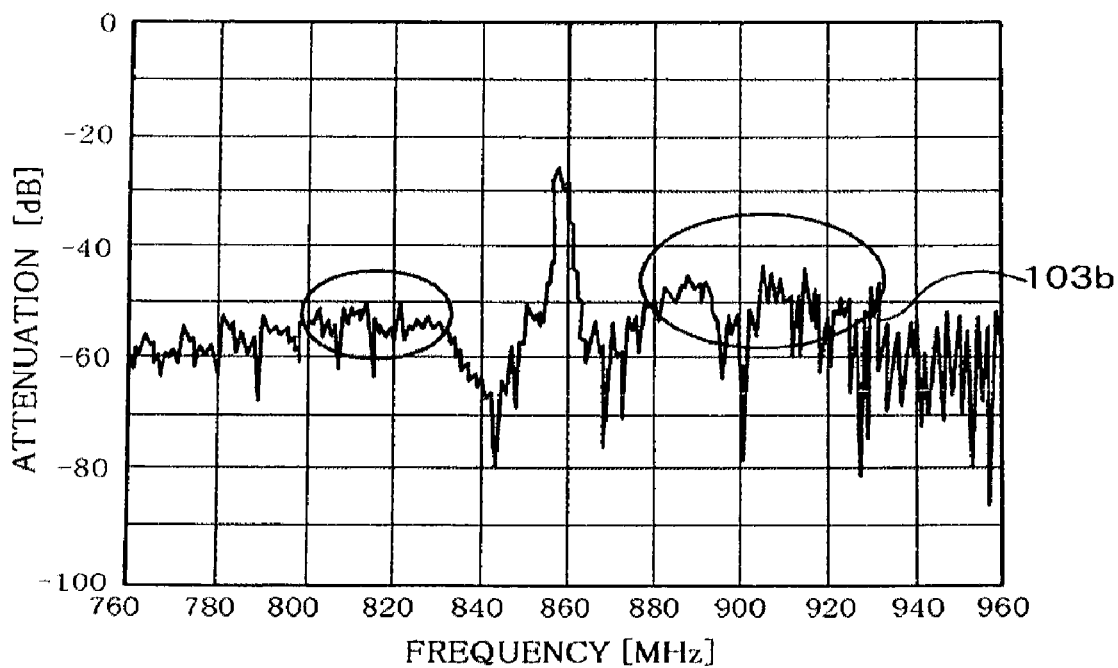

DUPLEXER INCLUDING FIRST AND SECOND ADDITIONAL GRATING REFLECTORS

TECHNICAL FIELD

The present invention relates to a duplexer that separates and extracts a transmission signal and a reception signal having different frequencies in order to conduct transmission/reception using a common antenna.

BACKGROUND ART

A device having a two-way radio communication function such as a cellular phone, and a radio communication system using this type of device as a communication terminal provide a difference between a frequency of a transmission radio wave and a frequency of a reception radio wave and separate a transmission signal and a reception signal in a duplexer using the above frequency difference so that they can conduct transmission/reception using one antenna included in the communication terminal.

A duplexer is formed of a receiving side filter that filters (selects a frequency of) a reception radio wave and outputs the filtered radio wave to a reception processing unit in a device, and a transmitting side filter that filters (selects a frequency of) a transmission signal from a transmission processing unit in the device to output the filtered signal to an antenna, and has a center frequency different from that of the receiving side filter. Some of these filters employ a ladder-type filter in which small-sized and low-loss elastic wave resonators, which are, for example, SAW (Surface Acoustic Wave) resonators, are connected in a ladder form. Conventionally, these ladder-type filters are formed in different chips respectively, and the respective chips are combined on a substrate, and thereby a duplexer is formed.

In contrast to this, in accordance with recent further miniaturization of the cellular phone or the like, a smaller-sized duplexer has also been required, and as one means for the above, the present inventor has studied that the two ladder-type filters are stored in one chip to be modularized and to be formed into one chip.

For example, FIG. 13 shows a structure example of a duplexer 100 in which two ladder-type filters are formed into one chip. The duplexer 100 has a low band side filter 3 being a filter on a transmitting side and a high band side filter 4 being a filter on a receiving side integrally provided on a module substrate 10 constituting a base of a chip with respect to a single antenna port 2. In this example, the low band side filter 3 is formed on a square-shaped piezoelectric substrate 30 disposed in a region on the left side of a center of the module substrate 10, and the above piezoelectric substrate 30 is made of, for example, LiTaO$_3$, LiNbO$_3$, quartz crystal, or the like. When in FIG. 13, an upper side is set to the front and a lower side is set to the rear at present, in a half region of the right side on the piezoelectric substrate 30, three series arms 31a to 31c composed of SAW resonators are disposed in one line from the rear to the front, and in a region of the left side, two parallel arms 32a, 32b composed of SAW resonators similarly are disposed in one line from the rear to the front. Then, the respective series arms 31a to 31c are coupled in series by a connecting line 331, and further the parallel arm 32a, 32b is connected in parallel between the series arms 31a to 31c, and thereby a T-type five-stage ladder-type filter is formed.

It is designed in a manner that an input portion of a transmission signal to the series arm 31a is connected to a low band side filter port 6 provided on a left corner of a rear end of the module substrate 10 by a bonding wire 311, and a transmission signal from a not-illustrated transmission processing unit is input to the low band side filter 3. Further, an output portion of the transmission signal from the series arm 31c is connected to the antenna port 2 provided on a center portion of a tip side of the module substrate 10 by the bonding wire 311, and downstream sides of the respective parallel arms 32a, 32b are connected and grounded to ground ports 341, 342 provided on a left corner of the module substrate 10 in an arranged manner by the bonding wires 311 respectively.

Here, the respective SAW resonators 31a to 31c, 32a and 32b are composed of the previously described piezoelectric substrate 30 and electrode parts 8 patterned on the above piezoelectric substrate 30, and each of the electrode parts 8 includes an IDT (Interdigital Transducer) electrode 81 and grating reflectors (that will be called reflectors, hereinafter) 82 disposed on the right and left of the IDT electrode 81, which are shown in FIG. 14(a). Note that in the respective drawings to be explained hereinafter such as FIG. 13, there is sometimes a case that the IDT electrode 81 and the reflectors 82 are appropriately illustrated in a simplified manner as shown in FIG. 14(b).

On the other hand, the high band side filter 4 is formed in a ladder-type filter in which series arms 41a to 41c and parallel arms 42a to 42b composed of SAW resonators respectively are coupled to form a T-type circuit similarly to the previously described low band side filter 3. Detailedly, the high band side filter 4 has a piezoelectric substrate 40 different from the piezoelectric substrate 30 on a low band side filter 3 side provided in a region of the right side of the module substrate 10, and on the above piezoelectric substrate 40, the three series arms 41a to 41c are disposed from the front to the rear, and the two series arms 41a, 41b out of them are disposed in a half region of the left side of the piezoelectric substrate 40 and further the remaining single series arm 41c is disposed in a half region of the right side of the piezoelectric substrate 40 in two lines. Further, the three parallel arms 42a to 42c are disposed in two lines from the front to the rear so that the two parallel arms 42a, 42b on the front side are disposed in the half region of the right side of the piezoelectric substrate 40 and the remaining single parallel arm 42c is disposed in the half region of the left side of the piezoelectric substrate 40.

These series arms 41a to 41c are connected in series by a connecting line 431 one another, and the parallel arm 42a to 42c is connected in parallel between the series arms 41a to 41c and connected in parallel to the series arm 41c at a rear stage, and thereby a T-type six-stage ladder-type filter is formed. The reason why the number of stages of the parallel arms on a high band side filter 4 side is increased by one stage in this example is that an attenuation of the high band side filter 4 with respect to a low frequency signal is increased to prevent the low frequency signal from flowing into a reception processing unit side.

Then, it is designed in a manner that an inlet side of a reception signal in the series arm 41a is connected to the previously described antenna port 2 by a bonding wire 411, and an outlet side of the reception signal from the series arm 41c is connected to a high band side filter port 7 provided on a right corner of the rear end of the module substrate 10 by the bonding wire 411, and then the reception signal that has passed through the high band side filter 4 can be output to a not-illustrated reception processing unit. Further, outlet sides of the three parallel arms 42a to 42c are connected and grounded to ground ports 441 to 443 provided on a right corner of the module substrate 10 from the tip to the rear in an arranged manner by the bonding wires 411 respectively.

Here, the respective bonding wires 311, 411 on the low band side filter 3 side and the high band side filter 4 side form inductors for adjusting positions of low band side pass frequency bands 104, 105 of respective low band side filter characteristics 101, 102. Further, for easier identification, in each of the drawings to be explained hereinafter, an identification code of "s" is appropriately attached to the series arms 31a to 31c, 41a to 41c, and an identification code of "p" is appropriately attached to the parallel arms 32a and 32b, 42a to 42c.

The two filters 3, 4 are formed into one chip, thereby making a region where, for example, a chip cover is provided in common to enable miniaturization of the duplexer 100 to be achieved. However, when the duplexer 100 shown in FIG. 13 is well seen, for example, a cutting margin "$a_1$" is provided to the right of the series arms 31a to 31c disposed in the region of the left side of the low band side filter 3. The above cutting margin is provided for the reason that when the electrode parts 8 and the connecting line 331 are patterned to form a large number of the filters 3 on, for example, a piezoelectric wafer and each of the filters 3 is cut off from the above wafer, damage to the electrode parts 8 and the like formed on the wafer is prevented, and is set to, for example, "$a_1$=50 μm" or so.

Such a cutting margin is similarly provided also in the high band side filter 4, (which is described as "$a_2$"), and even though the low band side filter 3 and the high band side filter 4 are disposed to make a distance "b" between, for example, the two piezoelectric substrates 30 and 40 approach to several μm or so, a distance ($a_1$+$a_2$+b) of 100 μm or more is needed between the two filters 3 and 4, which results in a cause of preventing further miniaturization of the duplexer 100. Thus, the present inventor forms a duplexer 100a by patterning the low band side filter 3 and the high band side filter 4 on a common piezoelectric substrate 11 as shown in FIG. 15, thereby omitting cutting margins between these filters 3 and 4 to achieve further miniaturization of the duplexer 100a.

However, when the duplexer 100a shown in FIG. 15 is manufactured and a frequency characteristic thereof is measured, a deterioration in a characteristic, which is a later-described isolation characteristic concretely, of the duplexer 100a is confirmed as compared with the conventional duplexer. Thus, the cause in which such a deterioration is seen is pursued, and then it is found that the low band side filter 3 and the high band side filter 4 are formed on the common piezoelectric substrate 11, and thereby as shown by wavy line arrows in FIG. 15, SAWs leaked from the reflectors 82 reach the resonators adjacent to each other in a main propagation direction of SAWs, (which are, for example, between the series arm 31a and the parallel arm 42c, and between the series arm 31c and the series arm 41a in FIG. 15), in the low band side filter 3 and the high band side filter 4, resulting that the deterioration in the characteristic of the duplexer 100a is caused. Here, the main propagation direction of SAWs in the present invention is set to a propagation direction of SAWs matched to a direction in which respective electrode fingers 83 of the IDT electrode 81 are provided continuously as shown by arrows in FIG. 14(a).

In order to prevent interference as above, it is also possible to consider a method in which the respective resonators 31a to 31c, 32a, 32b and the respective resonators 41a to 41c and 42a to 42c are disposed in an offset manner not to be adjacent to each other in the main propagation direction of SAWs. However, there are also many cases that it is difficult in layout to dispose the respective resonators on the piezoelectric substrate 11 miniaturized as described previously in an offset manner. Further, in order to reduce a leakage amount of a SAW, a method to widen a width of the reflector 82 can also be considered. However, each of the reflectors 82 plays a role of again reflecting a SAW propagated to the side of the IDT electrode 81 to the IDT electrode 81, so that in the case when a width of the reflector 82 on one side of the reflectors 82 provided on the right and left of the IDT electrode 81 is widened, a width of the reflector 82 on the other side also has to be similarly widened not to deteriorate characteristics of the filters 3, 4, which results in a cause of preventing miniaturization of the duplexer 100a.

Here, in Patent Document 1, there has been described a duplexer on which SAW resonators formed in a manner that in order to reflect a SAW to leak in a main propagation direction from a reflector and a SAW to leak in a direction inclined relative to the above main propagation direction, four or six of additional reflectors are provided in directions in which these SAWs leak, are mounted. However, Patent Document 1 in which the duplexer is described does not explain that in the case in which disposition relationship the two SAW resonators are, the SAW leaked from the reflector causes a deterioration in an isolation characteristic of the duplexer. Thus, four or six of the additional reflectors are provided in all the SAW resonators, thereby increasing a disposition area of each of the SAW resonators, and the existence of these additional reflectors prevents further miniaturization of the duplexer.

Further, the art described in Patent Document 1 employs mounting in a flip chip system, and is constituted in a manner that an annular electrode is provided around the periphery of each of a low band side filter and a high band side filter, and parallel arms are connected to the above annular electrode to be grounded. In contrast to this, in the case when mounting by, for example, a bonding wire system is employed, a method of how the duplexer 1 is miniaturized is not disclosed.

[Patent Document 1]
Japanese Patent Application Laid-open No. 2007-97117: paragraph 0065, paragraphs 0075 to 0078, FIG. 2, FIG. 5

DISCLOSURE OF THE INVENTION

Problems to be Solved by the Invention

The present invention has been made based on such circumstances, and an object thereof is to provide a miniaturized duplexer having a good isolation characteristic.

Means for Solving the Problems

A duplexer according to the present invention provided with a high band side filter and a low band side filter provided on a common piezoelectric substrate, in which these filters are ladder-type filters including elastic wave resonators to be series arms each provided with grating reflectors at both ends of an IDT electrode and elastic wave resonators to be parallel arms each provided with grating reflectors at both ends of an IDT electrode, the duplexer includes:

a first elastic wave resonator included in one of the high band side filter and the low band side filter;

a second elastic wave resonator included in the other of the high band side filter and the low band side filter and being adjacent to the first elastic wave resonator in a main propagation direction of elastic waves; and a first additional grating reflector provided between the first elastic wave resonator and the second elastic wave resonator and for reflecting an elastic wave leaked from a grating reflector of the first elastic wave resonator, and in which an additional grating reflector is not provided on a side opposite to the second elastic wave resonator in the first elastic wave resonator.

Here, the main propagation direction indicates a propagation direction of elastic waves matched to a direction in which respective electrode fingers of the IDT electrode are provided continuously.

The above duplexer further includes a second additional grating reflector provided between the first elastic wave resonator and the second elastic wave resonator and for reflecting an elastic wave leaked from a grating reflector of the second elastic wave resonator, and the duplexer may also be formed in a manner that an additional grating reflector is not provided on a side opposite to the first elastic wave resonator in the second elastic wave resonator, and in the above case, the second additional grating reflector is preferably provided between the grating reflector of the first elastic wave resonator and the first additional grating reflector.

Further, in the case when the above-described respective duplexers are connected to ground ports, they may be formed in a manner that the respective parallel arms in the high band side filter and the low band side filter are disposed in peripheral edge regions on the piezoelectric substrate, and the ground ports are disposed around the periphery of the piezoelectric substrate, and the ground ports and the respective parallel arms are connected.

Furthermore, it is suitable that a pitch between electrode fingers provided in the said additional grating reflectors falls within a range of not less than 0.97 times nor more than 1.03 times a pitch between electrode fingers in the grating reflectors from which elastic waves to be reflected in the said additional grating reflectors leak. Then, besides the above, the electrode fingers provided in the said additional grating reflectors may also be disposed to be each inclined with a narrow angle larger than 0° and smaller than 90° with respect to a direction in which elastic waves that leak from the grating reflectors and are reflected in the said additional grating reflectors propagate.

Effect of the Invention

According to the present invention, as long as two elastic wave resonators provided in respective filters forming a duplexer are adjacently disposed in a main propagation direction of elastic waves each other, additional grating reflectors for reflecting elastic waves to leak from existing reflectors are provided, and in the case when the elastic wave resonators are not adjacent to each other in the above main propagation direction, additional grating reflectors are not provided. That is, the additional grating reflectors are limitedly disposed at positions where an effect of elastic waves leaked from the existing grating reflectors on an isolation characteristic is large, thereby enabling the isolation characteristic of the duplexer to be improved while suppressing the degree of an increase in disposition areas of the filters.

BRIEF DESCRIPTION OF DRAWINGS

FIG. 6(a) to FIG. 6(d) are enlarged plan views showing modified examples of the additional reflectors;

FIG. 10(a) to FIG. 10(c) are enlarged plan views each showing an additional reflector in which electrode fingers are inclined;

FIG. 12(a) and FIG. 12(b) are characteristic diagrams showing isolation characteristics of duplexers according to an example and a comparative example;

BEST MODE FOR CARRYING OUT THE INVENTION

Figure 1:
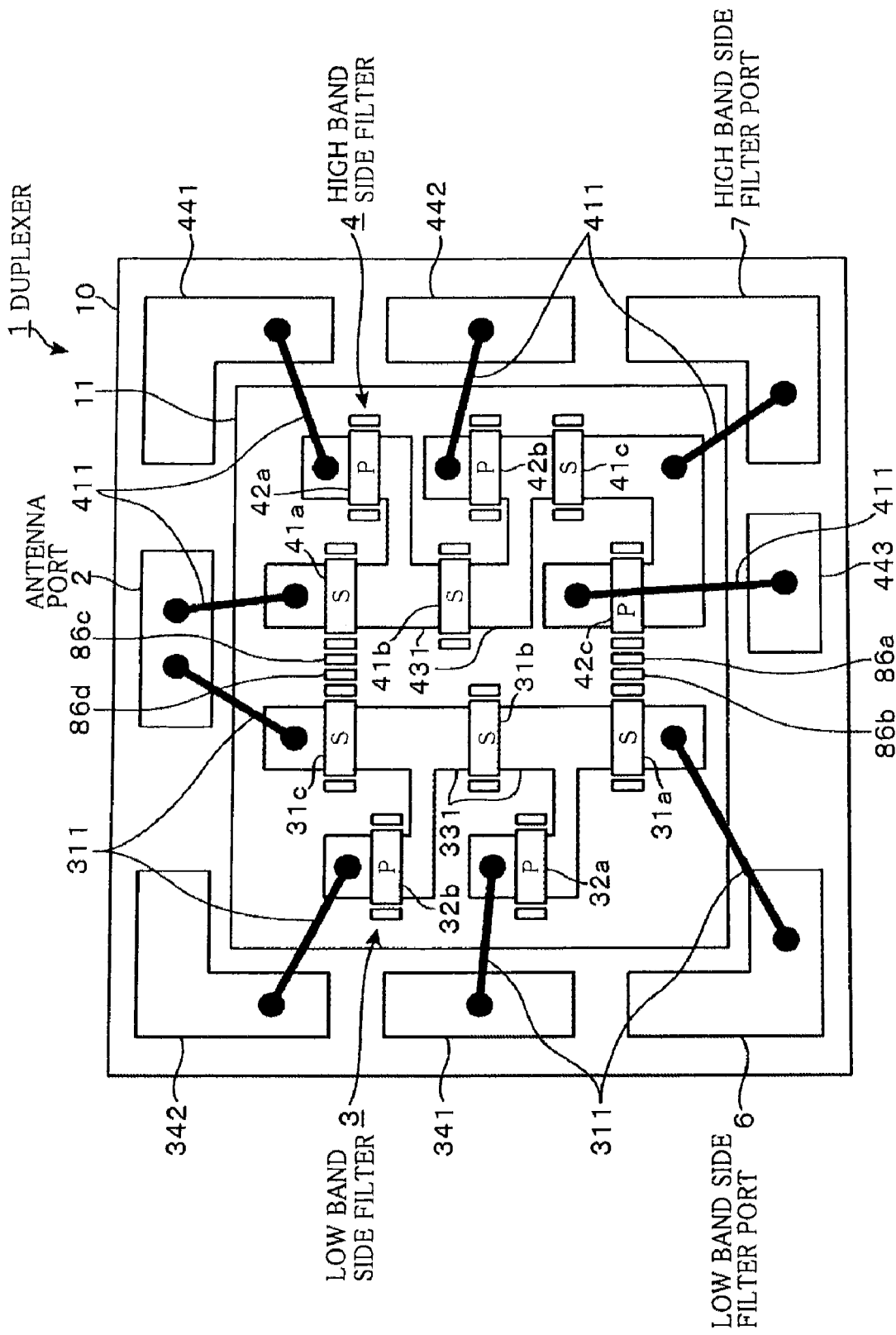
FIG. 1 is a plan view showing a structure example of a duplexer according to an embodiment of the present invention.

Hereinafter, the structure of a duplexer 1 according to the present embodiment will be explained with reference to a plan view shown in FIG. 1. The duplexer 1 shown in FIG. 1 has a low band side filter 3 composed of a T-type five-stage ladder-type filter and a high band side filter 4 composed of a T-type six-stage ladder-type filter formed on a common piezoelectric substrate 11. The structures of these respective filters 3, 4, the structures, dispositions, and connecting states of respective series arms 31a to 31c and 41a to 41c, and parallel arms 32a, 32b, and 42a to 42c are similar to those of a duplexer 100a that has been explained by using FIG. 15, so that repeated explanation is omitted.

Figure 2:
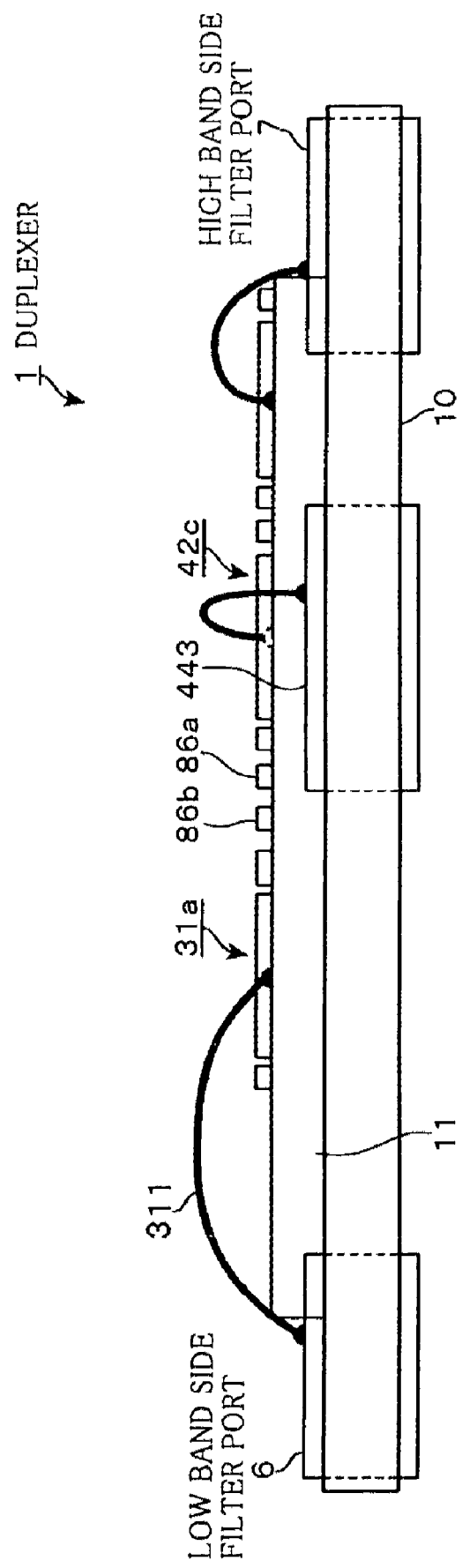
FIG. 2 is a side view of the duplexer.

Here, in the high band side filter 4 in the duplexer 1 according to this embodiment, the reason why the third-stage parallel arm 42c is disposed at a rear position of the first-stage and second-stage series arms 41a, 41b as shown in FIG. 1 is that as a shield dividing an electric field and a magnetic field to be generated between a bonding wire 311 connecting between the first-stage series arm 31a in the low band side filter 3 and a low band side filter port 6 and a bonding wire 411 connecting between the third-stage series arm 41c in the high band side filter 4 and a high band side filter port 7, the bonding wire 411 connecting an outlet portion of the parallel arm 42c and a ground port 443 is used to reduce couplings (a capacitive coupling and an electromagnetic coupling) to occur by these electric field and magnetic field, resulting that an isolation characteristic of the duplexer 1 is improved. The bonding wire 411 coupling the outlet portion of the parallel arm 42c and the ground port 443 is formed to, as schematically shown in a side view in FIG. 2, be bonded to form a mountain shape by striding over the above parallel arm 42c and avoid interference with the parallel arm 42c, and further the other bonding wires 311, 411 are also bonded to form a mountain shape similarly.

Figure 3:
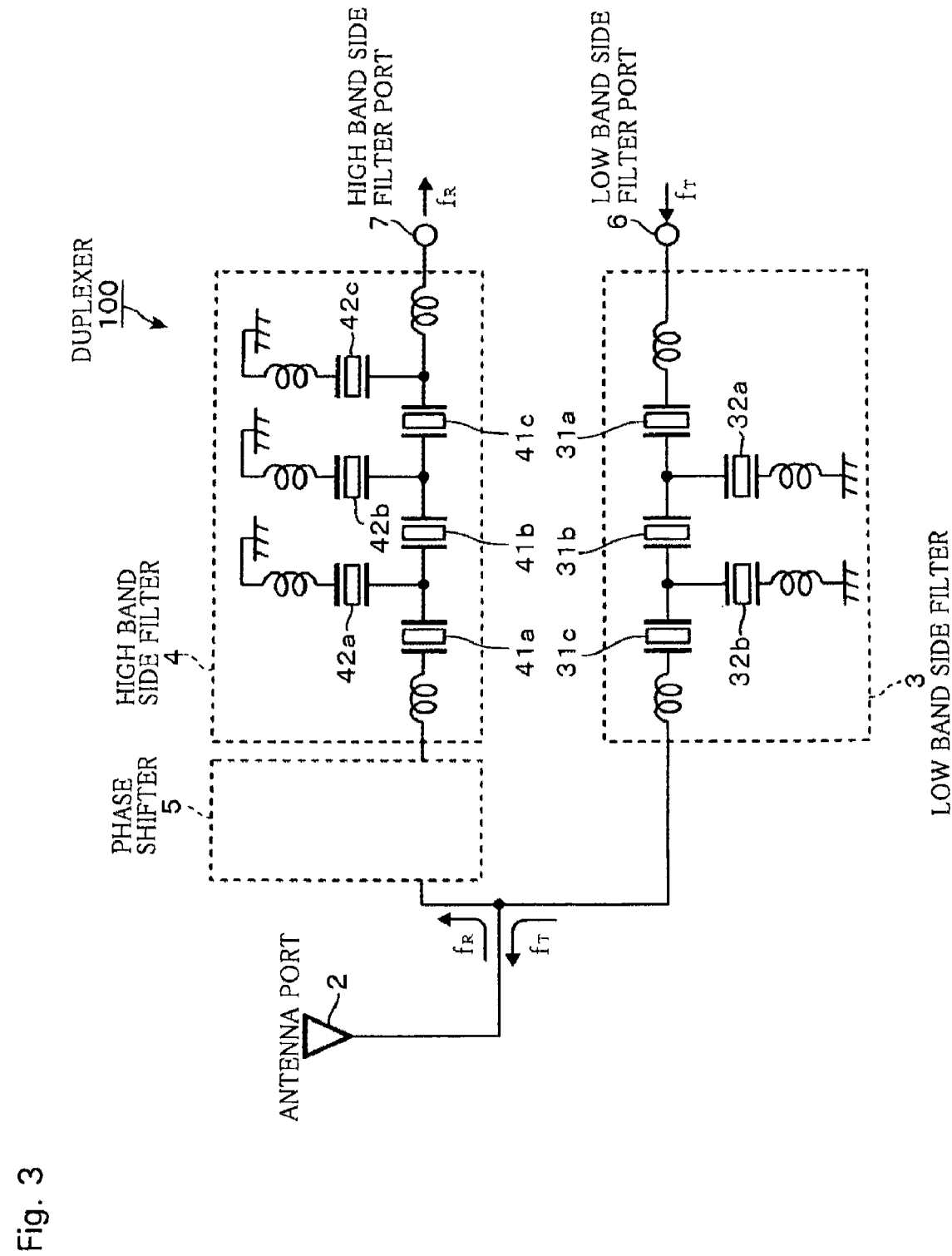
FIG. 3 is a circuit diagram of the duplexer.

The structure as above is provided, and thereby the duplexer 1 according to this embodiment functions as the duplexer 1 provided with the low band side filter 3 and the high band side filter 4 shown in a circuit diagram in FIG. 3. The respective filters 3, 4 in the duplexer 1 are formed to exhibit a high band side filter characteristic 102 having a high band side pass frequency band 105 shown in FIG. 4 with respect to a received current to flow to the high band side filter port 7 from an antenna port 2, and exhibit a low band side filter characteristic 101 having a low band side pass frequency band 104 with respect to a transmitted current to flow to the antenna port 2 from the low band side filter port 6. Then, these two filters 3, 4 are designed to exhibit an isolation characteristic 103 having no pass frequency band between the low band side filter port 6 and the high band side filter port 7, thereby not allowing transmission/reception signals to flow in a direction opposite to a designed direction. Incidentally, a phase shifter 5 shown in FIG. 3, as an aim to reduce an insertion loss to be caused after a received current is separated into a low band side filter 3 side, plays a role of phase shifting a frequency of the received current received in a state where an impedance in the pass frequency band of the low band side filter 3 is increased in advance in accordance with the pass frequency band of the high band side filter 4. The phase shifter 5 is provided at an outside of the duplexer 1 formed into one chip according to this embodiment, so that the illustration is omitted in each of the drawings except FIG. 3.

Figure 4:
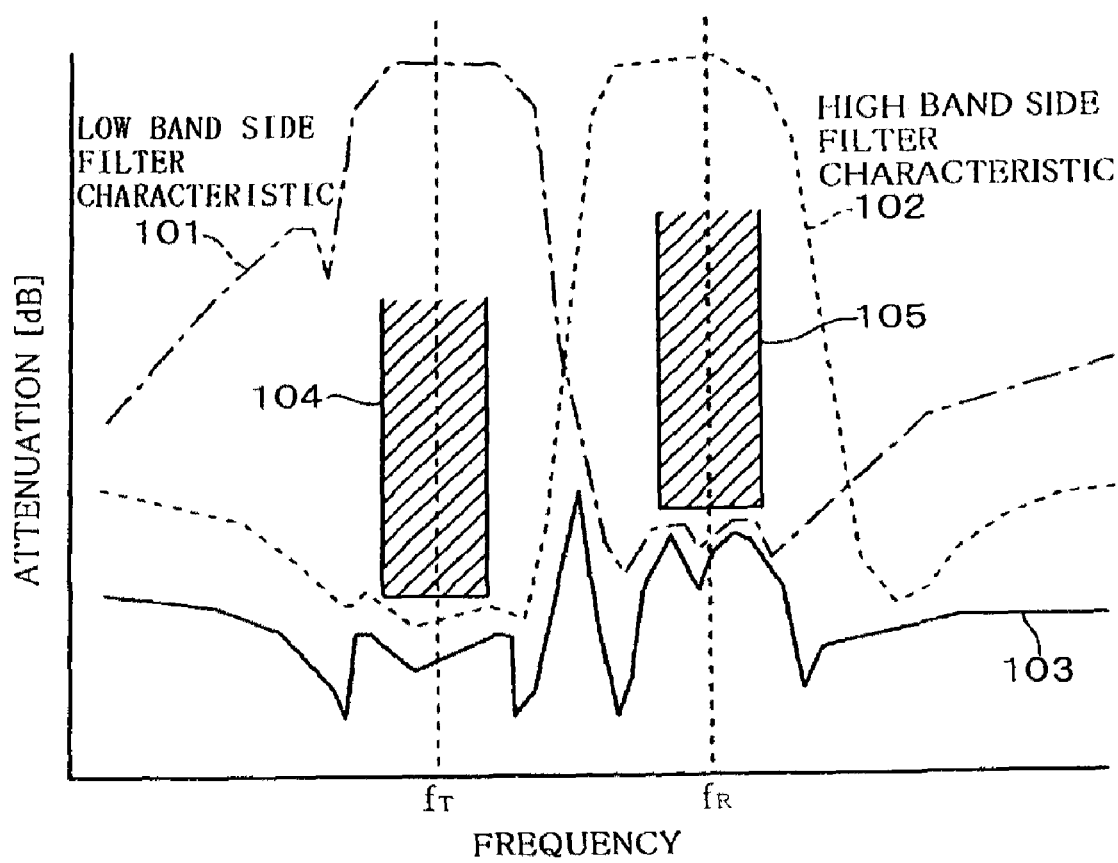
FIG. 4 is a characteristic diagram showing frequency characteristics of the duplexer.

In order to obtain the above-described high band side filter characteristic 102, the respective parallel arms 42a to 42c in the high band side filter 4 are set to have an interval (that will be called a pitch, hereinafter,) "PH" between centers of respective electrode fingers 83 shown in FIG. 14(*a*) so that an impedance with respect to a signal whose frequency is lower than that in the high band side pass frequency band 105 shown in FIG. 4 is minimized and an impedance with respect to a signal having a center frequency "$f_R$" in the high band side pass frequency band 105 is maximized.

Figure 14:
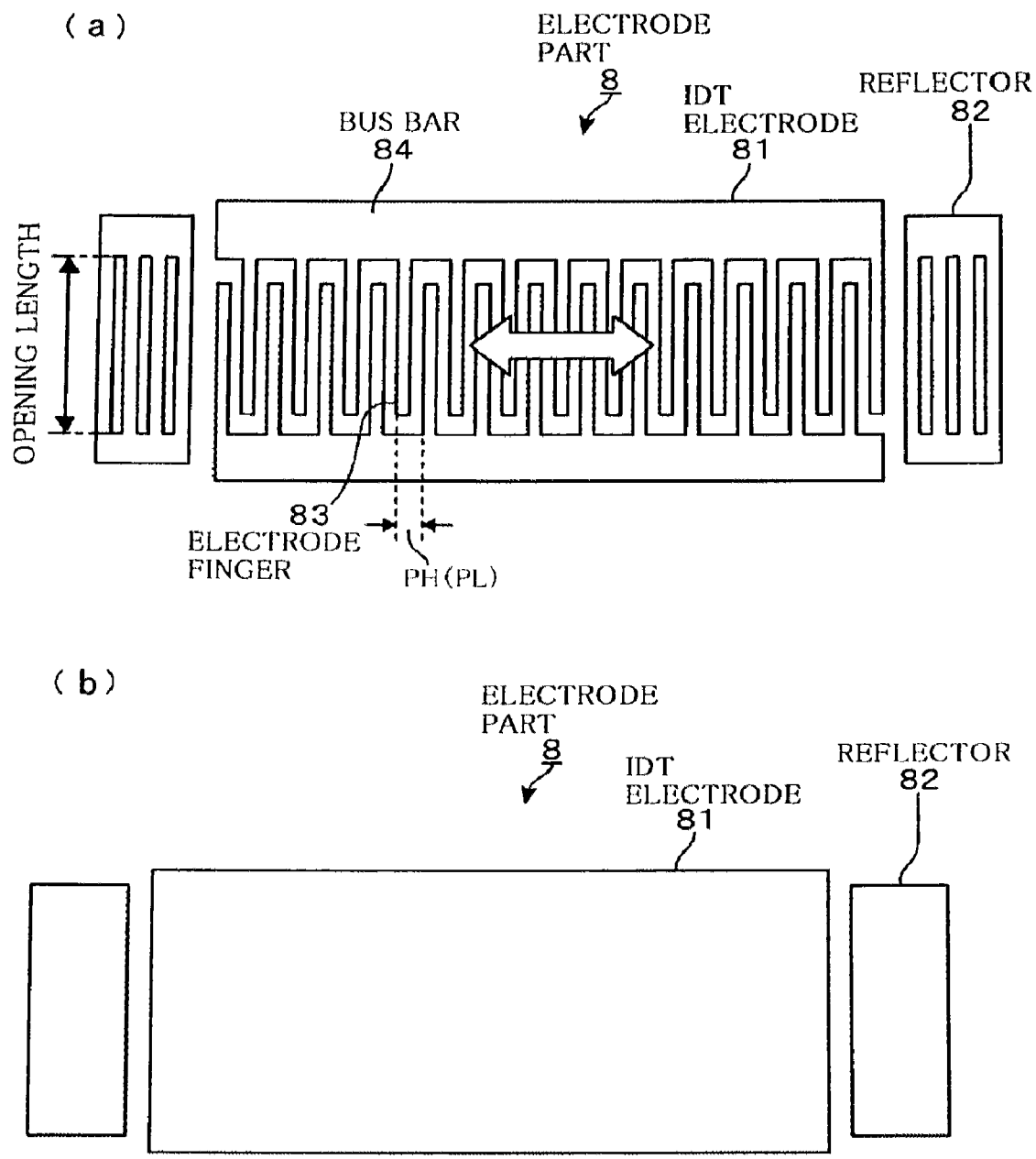
FIG. 14(a) and FIG. 14(b) are plan views showing structures of SAW resonators to be mounted on a duplexer.

On the other hand, the respective series arms 41a to 41c in the high band side filter 4 are set to have the pitch "PH" between the centers of the respective electrode fingers 83 shown in FIG. 14(*a*) so that an impedance with respect to a signal having the center frequency "$f_R$" in the high band side pass frequency band 105 is minimized and an impedance with respect to a signal whose frequency is higher than that in the high band side pass frequency band 105 is maximized. When the series arms 41a to 41c and the parallel arms 42a to 42c having the pitches between the electrode fingers 83 set as above are connected in a ladder form to form the high band side filter 4 and a reception signal having a frequency at which the impedance of the parallel arms 42a to 42c is minimized is applied to here, the respective parallel arms 42a to 42c are brought into a state of being short-circuited to ground ports 441 to 443 with respect to the reception signal, so that the above reception signal does not reach the high band side filter port 7.

When the frequency of the reception signal is increased from the above state, although the impedance of the parallel arms 42a to 42c with respect to the reception signal becomes high, the impedance of the series arms 41a to 41c is lowered, so that the first-stage series arm 41a to the third-stage series arm 41c are conducted, resulting that the reception signal reaches the high band side filter port 7. Then, when the frequency of the reception signal is further increased, the impedance of the series arms 41a to 41c becomes high, resulting that the reception signal does not flow into the series arms 41a to 41c from the antenna port 2. By such a function of the high band side filter 4, discrimination between frequency signals, in which the reception signal having a frequency in the high band side pass frequency band 105 is allowed to pass to the high band side filter port 7 from the antenna port 2 and the signal having a frequency that is not included in the high band side pass frequency band 105 is not allowed to reach the high band side filter port 7, is made possible as shown in FIG. 4.

Further, the low band side filter 3 on the other side is also set to have a pitch "PL" between the electrode fingers 83 of each of the series arms 31a to 31c and the parallel arms 32a, 32b so that the low band side filter characteristic 101 in which a transmission signal having a frequency in the low band side pass frequency band 104 is allowed to pass to the antenna port 2 from the low band side filter port 6 and a signal having a frequency that is not included in the low band side pass frequency band 104 is not allowed to reach the antenna port 2, is achieved by a principle similar to that of the above-described high band side filter 4.

The duplexer 1 provided with the structure and function explained above according to this embodiment is provided with additional grating reflectors for suppressing a deterioration in the isolation characteristic by SAWs to leak in the main propagation direction from reflectors 82, which have been explained in Background Art. Hereinafter, the structure of the above will be explained.

For example, the duplexer 1 shown in FIG. 1 is in a state where the first-stage series arm 31a in the low band side filter 3 and the third-stage parallel arm 42c in the high band side filter 4 are adjacently disposed in the main propagation direction of SAWs. Then, between the series arm 31a and the parallel arm 42c, additional grating reflectors 86a, 86b (that will be called additional reflectors 86a, 86b, hereinafter) for preventing a SAW leaked from the reflector 82 on one side from reaching the resonator 42c on the other side and preventing a SAW leaked from the reflector 82 on one side from reaching the resonator 31a on the other side.

Figure 5:
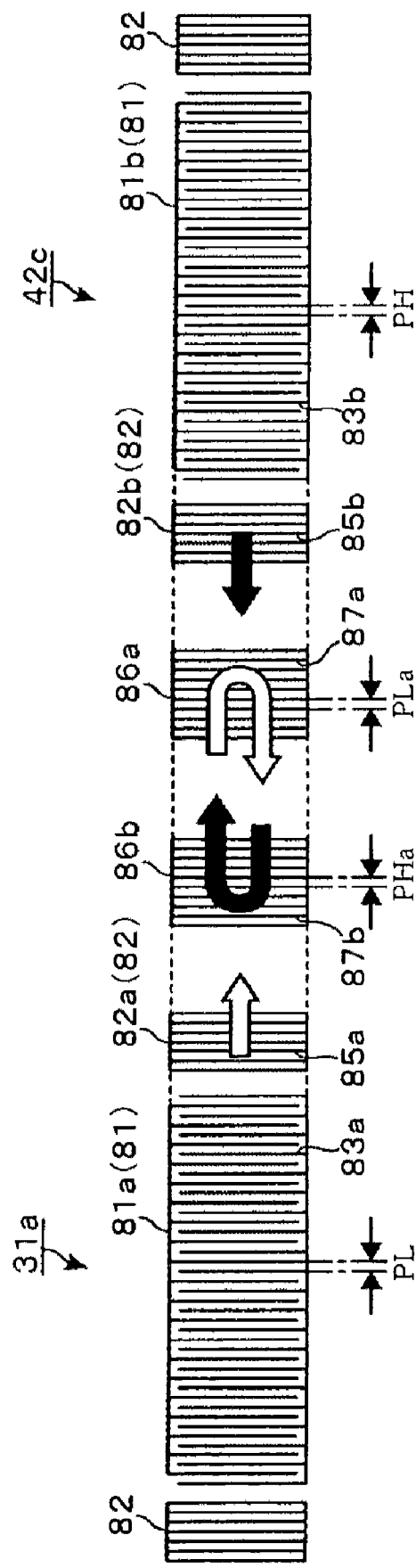
FIG. 5 is an enlarged plan view showing a structure example of additional reflectors provided in the duplexer.

Here, the state where the two SAW resonators 31a, 42c are "adjacently disposed in the main propagation direction of SAWs" indicates a disposition state where as shown by dotted lines in an enlarged plan view in FIG. 5, for example, an IDT electrode 81b of the parallel arm 42c on a partner side exists within a region where a SAW leaked from a reflector 82a on a series arm 31a side propagates, and the SAW from the series arm 31a side can reach the IDT electrode 81b. Then, in the above case, a SAW leaked from a reflector 82b of the parallel arm 42c can also be said to be in a state of being capable of reaching the series arm 31a on a partner side.

In the two SAW resonators 31a, 42c in the disposition state as above, at present, for example, when a reception signal having a frequency lower than that in the high band side pass frequency band 105 shown in FIG. 4 is assumed to be applied to the high band side filter 4 from the antenna port 2, the parallel arm 42c is brought into a state of being short-circuited to the ground port 443 as described previously, and a SAW is excited in the parallel arm 42c. At this time, when the SAW leaks from the reflector 82b of the parallel arm 42c to reach an IDT electrode 81a of the series arm 31a, as shown in FIG. 4, a frequency region on a low frequency side in the high band side pass frequency band 105 is the low band side pass frequency band 104, or a frequency region close to the above low band side pass frequency band 104 of the low band side filter 3, and thus there arises a fear that the SAW is mechano-electrically converted in the IDT electrode 81a of the series arm 31a to allow a current to flow in the low band side filter 3. It is inferred that the deterioration in the isolation characteristic 103 of the duplexer 1 that has been explained in Background Art occurs due to such a mechanism, for example, as one cause.

Thus, the duplexer 1 according to this embodiment is designed in a manner that the additional reflectors 86a, 86b are provided between the series arm 31a and the parallel arm 42c to reflect SAWs leaked from the reflectors 82b, 82a, thereby preventing the SAWs from reaching the SAW resonators 42c, 31a on the partner side or alternatively, even if the SAWs reach, the SAWs can be attenuated to the degree that the isolation characteristic is not affected. On the other hand, these SAW resonators 31a, 42c do not have additional reflectors provided in a direction in which the paired different SAW resonators in the filters 3, 4 are in the main propagation direction of SAWs but are not adjacently disposed, namely, for example, on the left side of the series arm 31a and on the right side of the parallel arm 42c, thereby suppressing the degree of an increase in disposition areas of the filters 3, 4.

As for the structure of the additional reflectors 86a, 86b, in the case when a pitch "PLa" between electrode fingers 87b of the additional reflector 86a to reflect a SAW from the series arm 31a side agrees with the pitch "PL" of the series arm 31a, it is possible to reflect the SAW most efficiently, but even if these pitches change, the pitches preferably fall within a range of "0.97 PL≦PLa≦1.03 PL". The low band side filter characteristic 101 of each of nine types of bands to be used in, for example, 3GPP (Third Generation Partnership Project) has a width of the pass band 105 within a range of approximately ±3% with respect to a center frequency "$f_T$", and the pitches "PL" of the IDT electrode 81a and the reflector 82a are set in accordance with the above center frequency. Because of this, when the pitch "PLa" of the additional reflector 82a changes over the above-described range, there is a fear that the additional reflector 82a can hardly reflect a SAW to be leaked from the reflector 82a. Further, similarly, a pitch between electrode fingers 87a of the additional reflector 86b to reflect a SAW from an additional reflector 86b side is also preferably set within a range of "0.97 PH≦PHa≦1.03 PH".

Further, as for the respective reflectors, as show in FIG. 5, the reflector on the series arm 31a side and the reflector on a parallel arm 42c side are alternately disposed in the order of, starting from the left side, the reflector 82a in the series arm 31a→the additional reflector 86b to reflect a SAW from the parallel arm 42c→the additional reflector 86a to reflect a SAW from the series arm 31a→the reflector 82b in the parallel arm 42c. By the above disposition, a SAW leaked from the reflector 82a in the series arm 31a, which is schematically shown by an outline arrow in FIG. 5, for example, passes through the additional reflector 86b for the parallel arm 42c and then reaches the additional reflector 86a for the series arm 31a to be reflected toward the series arm 31a here, so that a distance that the SAW again returns to the reflector 82a can be lengthened. Similarly, a SAW to be leaked from the reflector 82b on the parallel arm 42c side, which is shown by a black arrow in FIG. 5, also passes through a path symmetrical to that of the previously described SAW on the series arm 31a side to return to the reflector 82b, thereby enabling the SAW to propagate through the relatively long path.

As described above, the distance that the SAW leaked from each of the reflectors 82 returns to the reflector 82 again is lengthened, thereby enabling the SAW to be attenuated during a course of propagating in the piezoelectric substrate 11 as much as possible. As a result, although the additional reflectors 86a, 86b are provided and thereby the series arm 31a and the parallel arm 42c are formed in a manner that the reflected SAWs are input only to the reflector 82a on one side of the reflectors 82 provided on both sides of the IDT electrode 81a and to the reflector 82b on one side of the reflectors 82 provided on both sides of the IDT electrode 814b respectively, a right-left imbalance between the SAW to propagate to the IDT electrode 81a from the reflector 82a on the left and the SAW to propagate to the IDT electrode 81b from the reflector 82b on the right is suppressed as much as possible to enable an effect on the filter characteristics to be reduced.

The duplexer 1 that has been explained above according to the embodiment has the following effect. As long as the SAW resonator 31a provided in the low band side filter 3 forming the duplexer 1 and the SAW resonator 42c provided in the high band side filter 4 forming the duplexer 1 are adjacently disposed in the main propagation direction of SAWs each other, the additional reflectors 86a, 86b for reflecting SAWs to be leaked from the existing reflectors 82a, 82b are provided, and in the case when the elastic wave resonators are not adjacent to each other in the above main propagation direction, additional reflectors are not provided. That is, the additional reflectors 86a, 86b are limitedly disposed at positions where an effect of elastic waves leaked from the existing reflectors 82a, 82b on the isolation characteristic 103 is large, so that the isolation characteristic 103 of the duplexer 1 can be improved while suppressing the degree of an increase in disposition areas of the filters 3, 4.

Then, the respective parallel arms 32a, 32b, 42a to 42c are disposed in peripheral edge regions on the piezoelectric substrate 11, and the ground ports 341, 342, 441 to 443 are disposed around the periphery of the piezoelectric substrate 11, and they are connected by the bonding wires 311, 411, and thereby, for example, a distance that the bonding wires 311, 411 are led around does not become long to enable an entire size of the duplexer 100 to be miniaturized. Incidentally, a mounting method of the duplexer according to the present invention is not limited to the one using the bonding wires, and it is a matter of course that flip chip mounting may also be employed.

Further, the additional reflectors are not limited to the case where they are provided between the series arm on the low band side filter 3 side and the parallel arm on the high band side filter 4 side (between the previously described series arm 31a and parallel arm 42c, for example,) as shown in the previously described embodiment, and they may also be provided between the parallel arm on the low band side filter 3 side and the series arm on the high band side filter 4 side. Further, the additional reflectors may also be provided between the two respective series arms in the low band side filter 3 and the high band side filter 4, (which are additional reflectors 86c, 86d between the series arm 31c and the series arm 41a shown in FIG. 1, for example), or alternatively, the additional reflectors may also be provided between them.

Furthermore, the state where the two SAW resonators are adjacently disposed in the main propagation direction of SAWs is not limited to the case where the regions where the SAWs from the resonators on the right and left, (which are the series arm 31a, the parallel arm 42c in an example in FIG. 5), propagate are completely overlapped in a forward and rearward direction, as is the case illustrated in FIG. 5. As are two SAW resonators 8e, 8f shown in FIG. 6(a), for example, even when additional reflectors 86f, 86e are provided in the case where parts of regions where respective SAWs propagate are overlapped, the effect of improving the isolation characteristic of the duplexer 1 can be obtained. In the above case, positions in the forward and rearward direction where the additional reflectors 86e, 86f are provided may also be matched to positions of the SAW resonators 8f, 8e where the reach of the SAWs is prevented as shown in FIG. 6(a), or alternatively, may also be matched to positions of the SAW resonators 8e, 8f from which SAWs to be reflected leak as shown in FIG. 6(b).

Besides them, as a structure example of the additional reflectors 86e, 86f in the case where the parts of the regions where SAWs propagate are overlapped, as shown in FIG. 6(c), widths of the additional reflectors 86e, 86f in the forward and rearward direction may also be matched to an overlapping width of the SAWs. Further, the two SAW resonators 8e, 8f may also be disposed with inclinations relative to a propagation direction of SAWs as shown in FIG. 6(d). Even though the SAW resonators 8e, 8f are in such a disposition state, in the case when an IDT electrode 81e and 81f on a partner side exists within a region where a SAW leaked from a reflector 82f and 82e propagates and the SAWs are in a state of being reachable, the additional reflectors 86f, 86e are disposed, thereby enabling the isolation characteristic 103 of the duplexer 1 to be improved.

Figure 7:
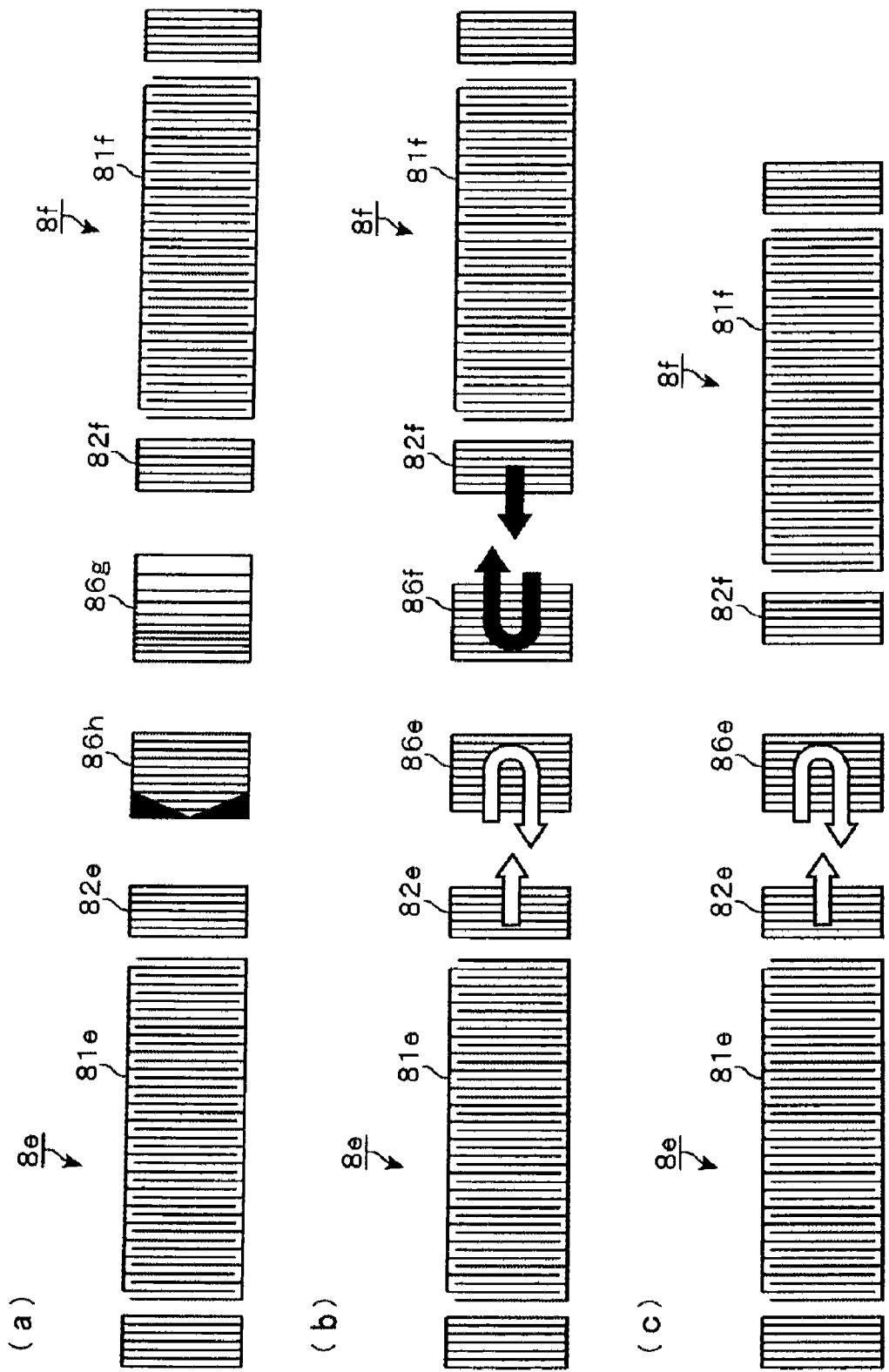
FIG. 7(a) to FIG. 7(c) are enlarged plan views showing other modified examples of the additional reflectors.

Besides the above, the structure of the grating reflectors to be the additional reflectors are not limited to the one illustrated in the above-described embodiment, and as is an additional reflector 86g shown in FIG. 7(a), for example, a pitch between electrode fingers may also be changed continuously or intermittently, and further as is an additional reflector 86h shown in the same drawing, one portion or all of the additional reflector 86h may also be weighted. Besides the above, the disposition of the additional reflectors 86f, 86e is not limited to the case where the additional reflector 86f on the low band side filter 3 side and the additional reflector 86e on the high band side filter 4 side are alternately disposed as shown in the above-described respective embodiments. For example, a structure in which the respective additional reflectors 86f, 86e are disposed in the vicinities of the existing reflectors 82f, 82e, shown in FIG. 7(b), for example, a structure in which the additional reflector 86e is provided only for the reflector 82e on one side that affects the isolation characteristic 103 of the duplexer 1 in particular, shown in FIG. 7(c), and further a structure in which two or more of the additional reflector 86e and 86f to reflect a SAW leaked from the reflector 82e and 82f on one side are provided, are also included in the technical scope of the present invention.

Figure 8:
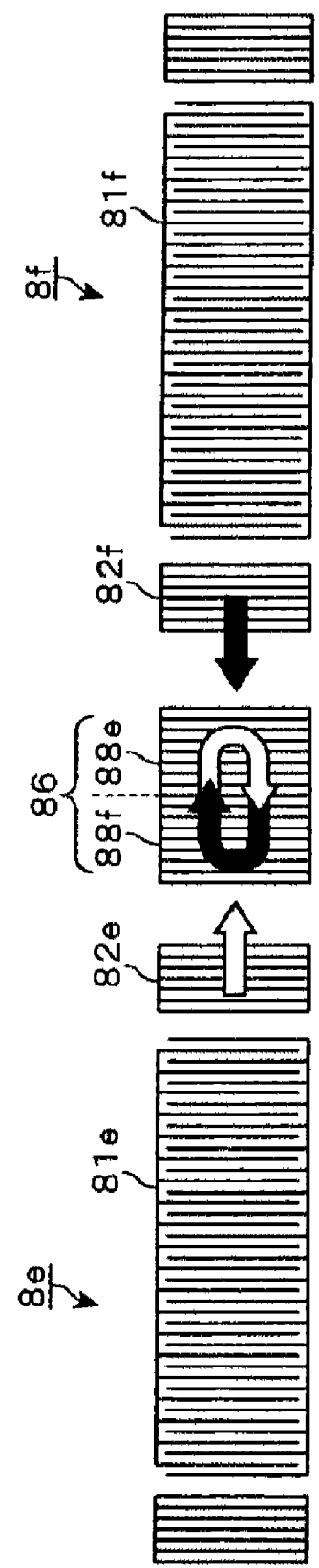
FIG. 8 is an enlarged plan view showing an example in which two additional reflectors are combined.

Further, as is an additional reflector 86 shown in FIG. 8, it may also be formed in a manner that two additional reflectors 86e, 86f are combined. In this example, in the right half of the additional reflector 86, the additional reflector part 88e having a pitch capable of reflecting a SAW leaked from the reflector 82e in the SAW resonator 8e on the left side is provided, and on the other hand, in the left half of the additional reflector 86, the additional reflector part 88f having a pitch capable of reflecting a SAW leaked from the reflector 82f in the SAW resonator 8f on the right side is provided.

Figure 9:
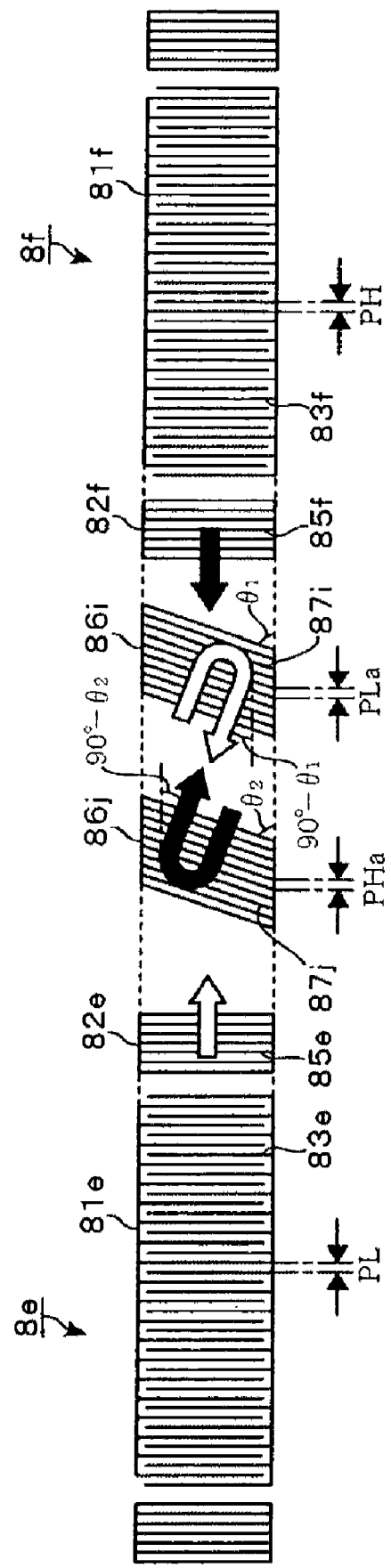
FIG. 9 is an enlarged plan view showing an example in which electrode fingers in additional reflectors are inclined.

Next, FIG. 9 shows an example of additional reflectors 86i, 86j provided with inclined electrode fingers 87i, 87j. In this example, as comprehensively shown in an enlarged view of FIG. 10(a) as the additional reflector 86, for example, the electrode fingers 87 are disposed to be inclined with respect to propagation directions of SAWs leaked from the respective SAW resonators 81e, 81f. Then, as for the above inclination, the electrode fingers 87 are disposed so that a magnitude θ of an angle formed by each of the electrode fingers 87 with respect to the propagation directions of the above-described SAWs, (which are matched to the main propagation direction of SAWs in the respective SAW resonators 8e, 8f in this example), on a narrow angle side becomes larger than 0° and smaller than 90°, more suitably the above-described θ falls within a range larger than 30° and smaller than 90°. In the additional reflector 86 in which the electrode fingers 87 are disposed to be inclined with respect to the propagation directions of the SAWs as above, the pitch "PLa (PHa)" between the electrode fingers 87 corresponds to an interval between centers of the two electrode fingers 87 in the main propagation direction of SAWs as shown in FIG. 10(a), FIG. 10(b).

In the example shown in FIG. 9, the respective electrode fingers 87i, 87j in the two additional reflectors 86i, 86j are inclined only at θ1, θ2 in the same direction respectively. Then, for example, when a SAW leaked from the reflector 82e in the SAW resonator 8e on the left side enters the additional reflector 86i from a wide angle side of an intersecting angle formed by a traveling direction of the SAW and the electrode finger 87i, in the additional reflector 86i, a propagation direction of the SAW is changed to a direction perpendicular to the electrode fingers 87i and the SAW is reflected toward the above direction. Thus, the SAW incident on the additional reflector 87i is eventually reflected toward the upper side with an inclination of (90°—θ1) with respect to the main propagation direction of SAWs as shown by an outline arrow on the additional reflector 87i. As a result, all or part of the reflected SAW propagates toward another direction without reaching the above-described SAW resonator 8e.

Here, when the SAW reflected in the additional reflector 86i reaches the SAW resonator 8e to be mechano-electrically converted, a spurious component unnecessary for output is included, or the like, which results in a cause of deteriorating characteristics of the filters 3, 4 including the SAW resonator 8e. Thus, the additional reflector 86i is provided to reflect the SAW toward a direction different from the direction in which the SAW reflector 8e is provided, thereby enabling a reduction in the characteristics of the filters 3, 4 to be suppressed.

In FIG. 9, the additional reflector 86j provided correspondingly to the SAW resonator 8f on the right side also plays a role of reflecting a SAW leaked from the reflector 86f in the SAW resonator 8f on the right side in a direction different from the direction in which the above-described SAW resonator 8f is provided similarly. That is, in the case of the above additional reflector 86j, a SAW enters from a narrow angle side of an intersecting angle formed by a traveling direction of the SAW and the electrode finger 87j, and a propagation direction is changed to a direction perpendicular to the electrode fingers 87i, and then the SAW is reflected toward the lower side with an inclination of (90°—θ2) with respect to the main propagation direction of SAWs as shown by a black arrow on the additional reflector 86j. As a result, all or part of the reflected SAW propagates toward another direction without reaching the above-described SAW resonator 8e, so that also in the above case, a reduction in the characteristics of the filters 3, 4 can be suppressed by providing the additional reflector 86j.

The respective additional reflectors 86i, 86j are not limited to the case where the electrode fingers are inclined in the same direction as shown in FIG. 9. They may also be formed in a manner that, for example, the additional reflector 86 in which the electrode fingers 87 are inclined in a clockwise direction as shown in FIG. 10(a) is set to the additional reflector 86j on one side and the additional reflector 86 in which the electrode fingers 87 are inclined in a counterclockwise direction as shown in FIG. 10(b) is set to the additional reflector 86i on the other side (FIG. 11(a)).

Figure 11:
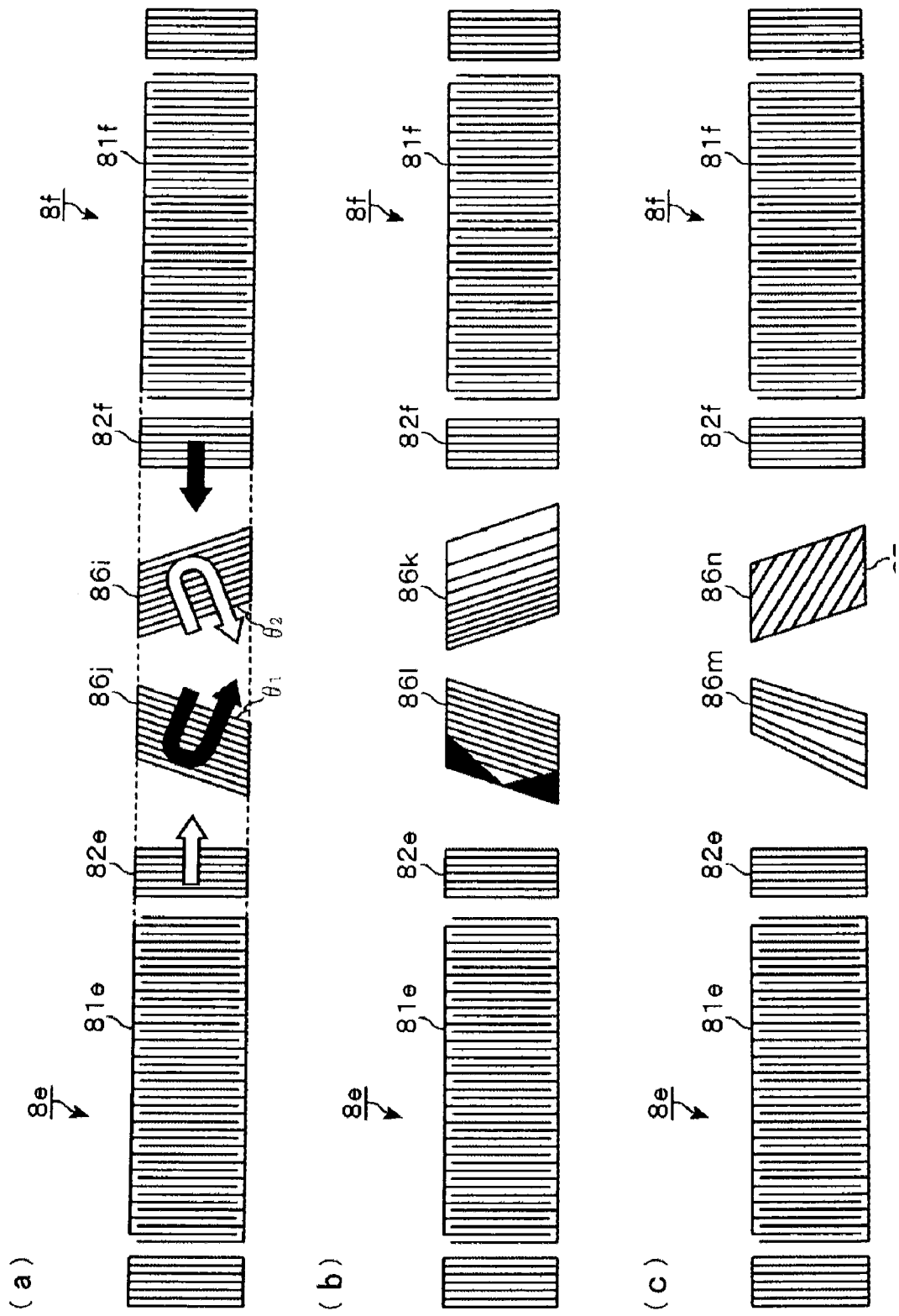
FIG. 11(a) to FIG. 11(c) are enlarged plan views showing modified examples of additional reflectors in which electrode fingers are inclined.
Figure 13:
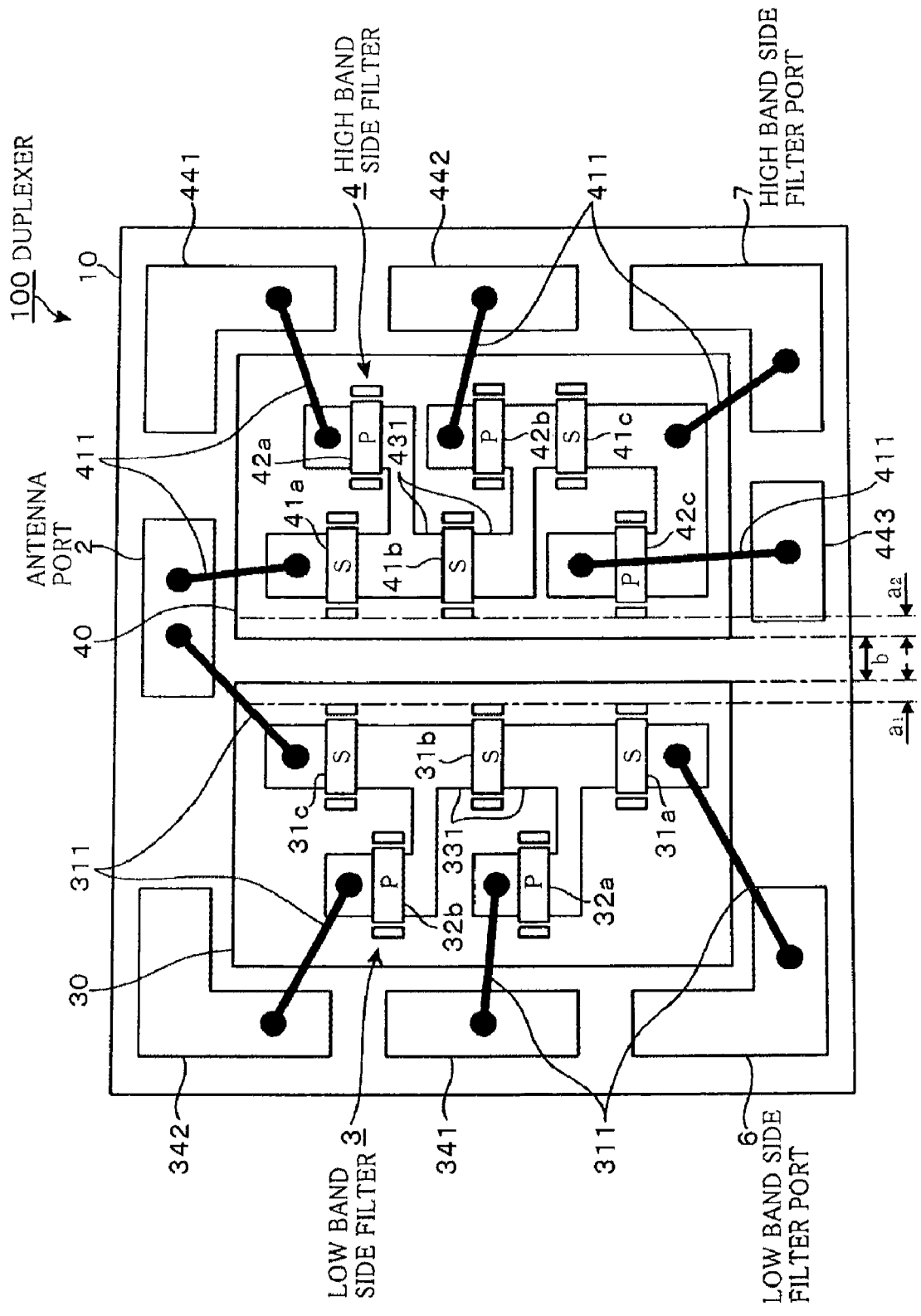
FIG. 13 is a plan view showing a structure example of a conventional duplexer.

Further, as for these additional reflectors 86 in which the electrode fingers 87 are inclined, similarly to the case shown in FIG. 7(a), a pitch between electrode fingers may also be changed continuously or intermittently as is an additional reflector 86k shown in FIG. 11(b) or alternatively, as is an additional reflector 86l shown in the same drawing, one portion or all of the additional reflector 86l may also be weighted. Furthermore, as is an additional reflector 86m in FIG. 11(c), a propagation direction of a SAW may also be changed in the additional reflector 86m by changing an inclination of the electrode finger 87 continuously or intermittently.

Further, as shown in FIG. 9, for example, in the case when the electrode fingers 87i, 87j are inclined, the respective electrode fingers 87 are preferably disposed to traverse an entire region where SAWs propagated from the respective SAW resonators 81e, 81f propagate. However, in the above case, when θ is made small, the additional reflector 86 is extended in the main propagation direction of SAWs to be increased in size as shown in FIG. 10(c), for example. Thus, as is an additional reflector 86n shown in FIG. 11(c), it may also be formed in a manner that the respective electrode fingers 87 are disposed to traverse only a part of a region where SAWs propagate to suppress increase in size of the additional reflector 86n.

Then, the elastic wave resonators to form the duplexer 1 are also not limited to the SAW resonators, and it is a matter of course that resonators using, for example, elastic boundary waves may also be used.

EXAMPLE

Experiment

Figure 15:
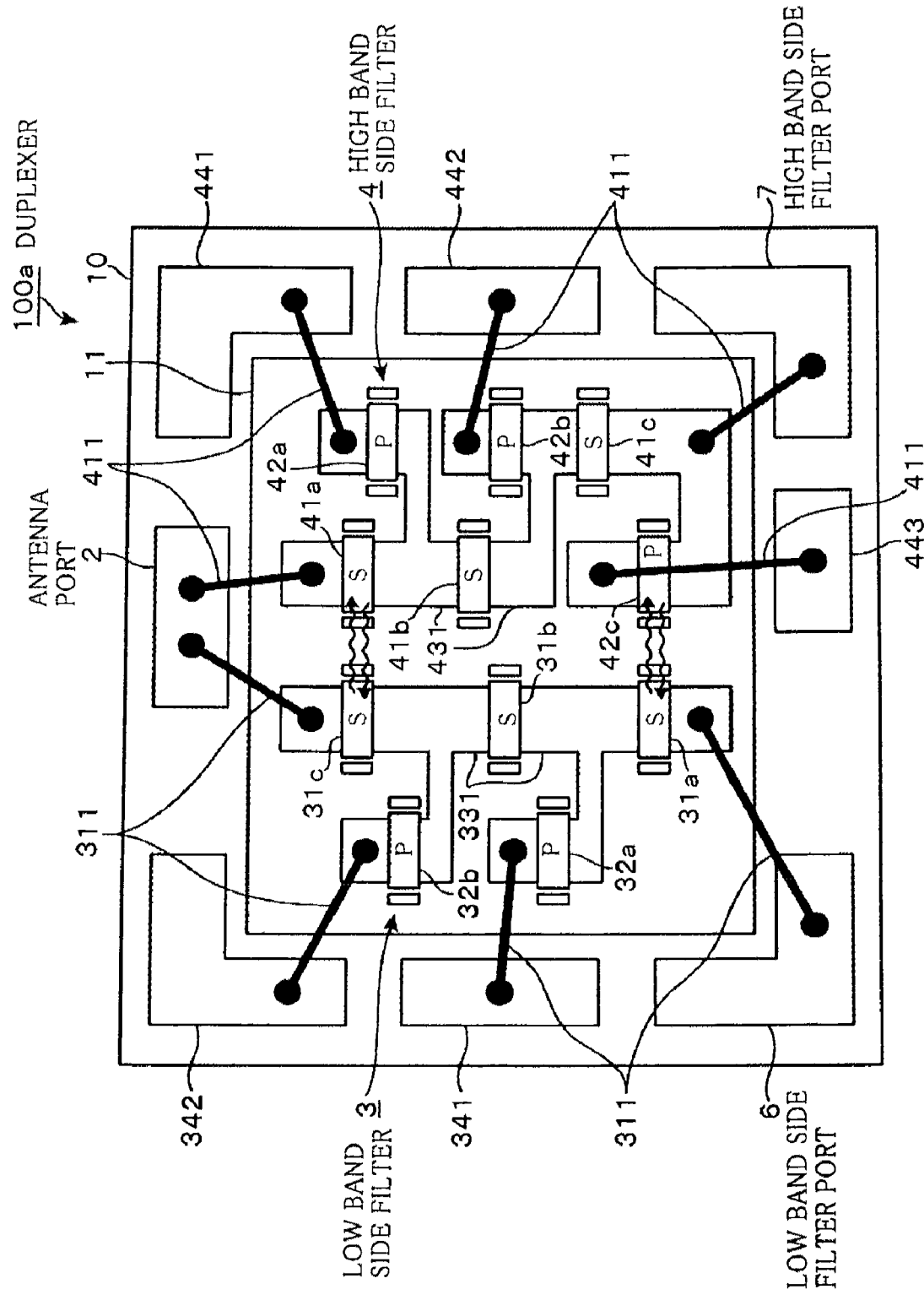
FIG. 15 is a plan view showing a second structure example of a conventional duplexer.

The duplexer 1 according to this embodiment and a duplexer 100 shown in FIG. 15 are manufactured and the isolation characteristics 103 are measured.

A. Experiment Condition

Example

The isolation characteristic 103 of the duplexer 1 having the respective series arms 31a to 31c, 41a to 41c, and the parallel arms 32a, 32b, 42a to 42c in the low band side filter 3 and the high band side filter 4 disposed similarly to those shown in FIG. 1 and having the additional reflectors 86b, 86a provided only between the series arm 31a and the parallel arm 42c is measured.

Comparative Example

The isolation characteristic 103 of the duplexer (corresponding to the duplexer 100 in FIG. 15) having respective series arms 31a to 31c, 41a to 41c, and parallel arms 32a, 32b, 42a to 42c disposed similarly to those of (Example) and not having additional reflectors 86b, 86a provided is measured.

B. Experiment Result

A result of (Example) is shown in a graph in FIG. 12(a), and a result of (Comparative Example) is shown in a graph in FIG. 12(b). In the respective graphs, a horizontal axis exhibits a frequency and a vertical axis exhibits an attenuation [dB] of a signal to flow between the low band side filter port 6 and the high band side filter port 7, namely the isolation characteristic.

When an isolation characteristic 103a of the duplexer 1 shown in FIG. 12(a) according to (Example) and an isolation characteristic 103b of the duplexer 100 shown in FIG. 12(b) according to (Comparative Example) are compared, in regions surrounded by ellipses in each of the drawings, for example, in the isolation characteristic 103b according to (Comparative Example), a phenomenon what is called "leakage of unnecessary waves", in which the attenuation becomes a value close to, for example, −50 dB, or a value smaller than the above (protrudes to a 0 dB side), is frequently confirmed over a wide frequency range.

In contrast to this, in the isolation characteristic 103a according to (Example), such "leakage of unnecessary waves" is reduced as compared with (Comparative Example), and further a drop in the attenuation is also suppressed to a relatively small fluctuation amount. Then, when the regions surrounded by the ellipses in these drawings are compared, for example, it is confirmed that the isolation characteristic 103a of (Example) is improved by 1 to 3 dB as compared with the isolation characteristic 103b of (Comparative Example) and the additional reflectors 86b, 86a are provided, thereby enabling the isolation characteristic 103a of the duplexer 1 to be improved.

EXPLANATION OF REFERENCE NUMERAL

1 duplexer
2 antenna port
3 low band side filter
4 high band side filter
5 phase shifter
6 low band side filter port
7 high band side filter port
8 electrode part
8f, 8e SAW resonator
10 module substrate
11 piezoelectric substrate
30 piezoelectric substrate
31a to 31c series arm
32a, 32b parallel arm
piezoelectric substrate 40
41a to 41c series arm
42a to 42c parallel arm
81, 81a, 81b, 81e, 81f IDT electrode
82, 82a, 82b, 82e, 82f reflector
83 electrode finger
84 bus bar
85 electrode finger
86, 86a to 86n additional reflector
87a, 87b electrode finger
100, 100a duplexer
311 bonding wire
331 connecting line
341, 342 ground port
411 bonding wire
431 connecting line
441 to 443 ground port

The invention claimed is:

1. A duplexer provided with a high band side filter and a low band side filter provided on a common piezoelectric substrate, in which these filters are ladder-type filters including elastic wave resonators to be series arms each provided with grating reflectors at both ends of an IDT electrode and elastic wave resonators to be parallel arms each provided with grating reflectors at both ends of an IDT electrode, the duplexer comprising:

a first elastic wave resonator included in one of the high band side filter and the low band side filter;

a second elastic wave resonator included in the other of the high band side filter and the low band side filter and being adjacent to said first elastic wave resonator in a main propagation direction of elastic waves;

a first additional grating reflector provided between said first elastic wave resonator and said second elastic wave resonator and for reflecting an elastic wave leaked from a grating reflector of said first elastic wave resonator; and a second additional grating reflector, provided between said first elastic wave resonator and said second elastic wave resonator, for reflecting an elastic wave leaked from a grating reflector of said second elastic wave resonator;

wherein an additional grating reflector is not provided on a side opposite to said second elastic wave resonator in said first elastic wave resonator, nor on a side opposite to said first elastic wave resonator in said second elastic wave resonator, and wherein said second additional grating reflector is provided between the grating reflector of said first elastic wave resonator and said first additional grating reflector.

2. The duplexer according to claim 1, wherein the respective parallel arms in the high band side filter and the low band side filter are disposed in peripheral edge regions on the piezoelectric substrate, and ground ports are disposed around the periphery of the piezoelectric substrate, and the ground ports and the respective parallel arms are connected.

3. The duplexer according to claim 1, wherein a pitch between electrode fingers provided in said additional grating reflectors is not less than 0.97 times nor more than 1.03 times a pitch between electrode fingers in the grating reflectors from which elastic waves to be reflected in said additional grating reflectors leak.

4. The duplexer according to claim 1, wherein the electrode fingers provided in said additional grating reflectors are disposed to be each inclined with a narrow angle larger than 0° and smaller than 90° with respect to a direction in which elastic waves that leak from the grating reflectors and are reflected in said additional grating reflectors propagate.

* * * * *